(12) United States Patent
Brandelero et al.

(10) Patent No.: US 11,929,346 B2
(45) Date of Patent: Mar. 12, 2024

(54) DEVICE AND METHOD FOR INCREASING THE RELIABILITY OF A POWER MODULE

(71) Applicant: MITSUBISHI ELECTRIC CORPORATION, Tokyo (JP)

(72) Inventors: Julio Cezar Brandelero, Rennes (FR); Stefan Mollov, Rennes (FR)

(73) Assignee: Mitsubishi Electric Corporation, Tokyo (JP)

( * ) Notice: Subject to any disclaimer, the term of this patent is extended or adjusted under 35 U.S.C. 154(b) by 36 days.

(21) Appl. No.: 17/912,287

(22) PCT Filed: Mar. 8, 2021

(86) PCT No.: PCT/JP2021/010262
§ 371 (c)(1),
(2) Date: Sep. 16, 2022

(87) PCT Pub. No.: WO2021/200057
PCT Pub. Date: Oct. 7, 2021

(65) Prior Publication Data
US 2023/0141711 A1      May 11, 2023

(30) Foreign Application Priority Data

Apr. 2, 2020   (EP) .................................. 20167777

(51) Int. Cl.
*H03K 3/011*     (2006.01)
*H01L 23/00*     (2006.01)

(52) U.S. Cl.
CPC .............. *H01L 24/85* (2013.01); *H03K 3/011* (2013.01); *H01L 2224/85948* (2013.01)

(58) Field of Classification Search
None
See application file for complete search history.

(56) References Cited

U.S. PATENT DOCUMENTS

| | | | |
|---|---|---|---|
| 11,114,349 B2 * | 9/2021 | Ewanchuk | H01L 23/58 |
| 11,251,151 B2 * | 2/2022 | Ewanchuk | H01L 24/83 |
| 2016/0233202 A1 | 8/2016 | Komo et al. | |

FOREIGN PATENT DOCUMENTS

| EP | 3 489 994 A1 | 5/2019 |
|---|---|---|
| EP | 3 489 997 A1 | 5/2019 |

* cited by examiner

*Primary Examiner* — Jeffery S Zweizig
(74) *Attorney, Agent, or Firm* — Birch, Stewart, Kolasch & Birch, LLP

(57) ABSTRACT

The present invention concerns a method and a device for increasing the reliability of a power module composed of plural power semiconductors that are connected in parallel, the power semiconductors being connected to the external pins of the package of the power module through metallic connections. The invention: —selects one power semiconductor among the power semiconductors connected in parallel according to a criterion, —applies a same input patient to the not selected power semiconductors connected in parallel, —increases the temperature of the selected power semiconductor in order to reach a target temperature of the power semiconductor during a time duration in order to achieve and interface grain homogenisation of the metallic connections of the selected power semiconductor, —applies the same input pattern to the selected power semiconductor after the time duration.

11 Claims, 5 Drawing Sheets

DEVICE AND METHOD FOR INCREASING THE RELIABILITY OF A POWER MODULE

TECHNICAL FIELD

The present invention relates generally to a method and device for increasing the reliability of a power module.

BACKGROUND ART

The electrical interconnections of power semiconductors of a power module are one of the weakest points of the power module. The state of electrical interconnections of power semiconductors is one of the factors that determines the power module end of life. Each power semiconductor is classically connected to the external pins of the package of the power module using wire bonding techniques. In the wire bonding process, a wire is bonded to the metallized power semiconductor surface and a metallized substrate using force, temperature and ultrasonic energy. These techniques normally result in a microscopic difference between the wire bond and the metallization that causes reliability issues.

During wire bonding process, the structure wire/metallization becomes harder and limits the amount of deformation that can be obtained before the breaking of the wire bond.

The region that is constituted by the wire bonded to the metallized power semiconductor surface undergoes mechanical stress caused by different thermal coefficients of thermal expansion (CTE), CTEs of the structure composing the power module packaging. Similar phenomena of hardening appear during the lifetime of the wire bonding/metallization contact. The thermomechanical stress associated to a hard material contributes to the crack formation on the bond between the wire bond and the metallization which finally results to a complete lift-off of the wire bond that can lead to the failure of the power module.

Today's techniques to increase the reliability of that type of interconnection include the use of Aluminium wires and more recently Silver or Copper wires.

SUMMARY OF INVENTION

The present invention aims to provide a device and a method for increasing the reliability of a power module.

To that end, the present invention concerns a device for increasing the reliability of a power module composed of plural power semiconductors that are connected in parallel, the power semiconductors being connected to the external pins of the package of the power module through metallic connections, characterized in that the device comprises:
means for selecting one power semiconductor among the power semiconductors connected in parallel according to a criterion,
means for applying a same input pattern to the not selected power semiconductors connected in parallel,
means for increasing the temperature of the selected power semiconductor in order to reach a target temperature of the power semiconductor during a time duration in order to achieve and interface grain homogenisation of the metallic connections of the selected power semiconductor,
means for applying the same input pattern to the selected power semiconductor after the time duration.

The present invention concerns also a method for increasing the reliability of a power module composed of plural power semiconductors that are connected in parallel, the power semiconductors being connected to the external pins of the package of the power module through metallic connections, characterized in that the method comprises the steps of:
selecting one power semiconductor among the power semiconductors connected in parallel according to a criterion, applying a same input pattern to the not selected power semiconductors connected in parallel,
increasing the temperature of the selected power semiconductor in order to reach a target temperature of the power semiconductor during a time duration in order to achieve and interface grain homogenisation of the metallic connections of the selected power semiconductor,
applying the same input pattern to the selected power semiconductor after the time duration.

Thus, the lifetime of the power module is increased by changing the microstructure and increasing the grain-size on the metallic connection structure of the selected power semiconductor thanks to the heat treatment. Consequently, a softer and more ductile metallic connection and interface is obtained that can support a large deformation caused by the temperature and the mismatched CTE of the different materials present on the power module structure. As the temperature on the power module imposes a given strain, the soft materials obtained according to the present invention present an increase of the reliability. The classical materials and techniques of metallic connections can be used with this method with an increase on the reliability and lifetime of the power module. The total power requested to increase the temperature of the selected power semiconductor is only a fraction of the total dissipated losses of the entire power module.

According to a particular feature, the criterion is the age of the metallic connection, wherein the power semiconductor with a recent metallic connection is inserted in a queue.

Thus, the fine and poorly sorted grain size on the metallic connection structure obtained during a classical process is modified in order to obtain a coarser grain size and consequently a soft material that can support more deformation without cracks or fracture.

According to a particular feature, the criterion is the deterioration of the metallic connection of the power semiconductor, the deterioration being estimated by the evolution of the junction temperature during the operation of the power semiconductor.

Thus, the process of grain homogenisation is repeated many times during the lifetime of the power module in order to relive the accumulated strain/stress on the metallic connection structure caused by the fatigue effects given the temperature swing during the operation of the power module.

According to a particular feature, the evolution of the junction temperature during the operation of the power semiconductor is estimated according to a rain flow algorithm that treats the historical data of the junction temperature in order to determine W different temperature levels with a number of cycles Ncw at a given temperature swing $\Delta Tjw$ and at a given average temperature $Tjw$, combined with a linear accumulation rule based on a damage-law using the following formula:

$$\sum_{w=1}^{W} \frac{Ncw}{A \cdot \Delta Tjw \cdot \exp\left(\frac{1}{Kc \cdot Tjw}\right)} \geq 1$$

where the coefficients A, α, Kc are previously determined with power cycling tests.

Thus, the process of grain homogenisation is only applied when the evolution of the grain structure becomes critical to the crack formation based on the knowledge of the grain evolution determined by previous power cycling tests and the actual historical stress level imposed on the power module by the temperature swing.

According to a particular feature, the time duration varies from 2 hours and up to 78 hours.

Thus, the microstructure of the metallic connection is modified by annealing effect at relative low temperature and the duration is relatively small.

According to a particular feature, the target temperature is smaller than the maximum junction temperature and smaller than the melting temperature of the power semiconductor interconnection.

Thus, the power semiconductor can be operational during the grain interface homogenisation and any especial support is necessary to maintain the die in place during this heat treatment.

According to a particular feature, the increase of the temperature of the selected power semiconductor is performed by inducing and controlling a leakage current of a power semiconductor.

Thus, the heat treatment is controlled on each power semiconductor during the normal operation with unchanged power module output waveforms (voltage/current), only few amperes are enough to increase the temperature given the other parallel power semiconductors are blocking the BUS voltage (V+-V−).

According to a particular feature, the leakage current is induced by increasing the gate to source or emitter voltage of the power semiconductor to a value that is comprised between 100 mV and 2V above the threshold voltage value of the selected power semiconductor.

Thus, the heat treatment controller may be integrated on the classical control unit of the selected power semiconductor given the compatibility of the voltage levels.

According to a particular feature, the gate to source or emitter voltage of the power semiconductor obtained using a pulse width modulator, the frequency of which is defined as:

$$F_{PWM90} \geq \frac{Vcc - Vee}{2 \cdot 0.1 \cdot \pi \cdot Cin \cdot Rg}$$

where Cin is the input capacitance of the power semiconductor, Rg is the sum of a resistance connected to the gate and an input resistance of the power semiconductor and Vcc and Vee are the positive and negative voltage rails of a gate driver that drives the power semiconductor.

Thus, a fully digital voltage regulator may be implemented using the classical hardware of a gate driver and the peak to peak ripple of the leakage current is inferior to 100 mV.

According to a particular feature, the gate to source or emitter voltage of the power semiconductor obtained using a pulse width modulator, the frequency of which is defined as:

$$F_{PWM1000} \geq \frac{VgL}{2 \cdot 0.1 \cdot \pi \cdot Cin \cdot (Rg + Rgl)},$$

where Cin is the input capacitance of the power semiconductor and Rg is the sum of a resistance connected to the gate and an input resistance of the power semiconductor, VgL is a voltage imposed across two switches that are controlled according to the pulse width modulator and that are linked through respective resistors to the positive and negative voltage rails of a gate driver that drives the power semiconductor.

Thus, the voltage applied to the gate driver may be reduced and/or the gate resistance may be increased during the controlled leakage mode, the frequency of the PWM modulator may be reduced reducing the losses on the gate driver switches and passive elements.

BRIEF DESCRIPTION OF DRAWINGS

The characteristics of the invention will emerge more clearly from a reading of the following description of example embodiments, the said description being produced with reference to the accompanying drawings.

DESCRIPTION OF EMBODIMENTS

Figure 1:
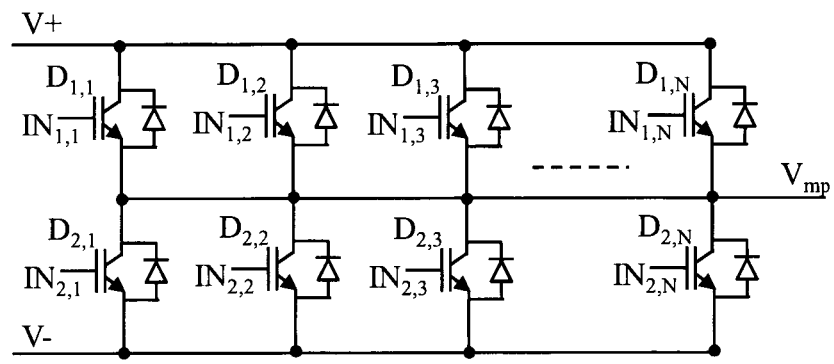
FIG. 1 represents an example of a power module comprising plural power semiconductors.

FIG. 1 represents an example of a power module comprising plural power semiconductors.

In the example of FIG. 1, a power module is composed of a plurality of semiconductors noted $D_{1,1}$ to $D_{1,N}$ and $D_{2,1}$ to $D_{2,N}$ where N is generally upper than four. The semiconductors noted $D_{1,1}$ to $D_{1,N}$ are connected in parallel and the semiconductors noted $D_{2,1}$ to $D_{2,N}$ are connected in parallel.

The power semiconductors $D_{1,1}$ to $D_{1,N}$ and $D_{2,1}$ to $D_{2,N}$ are connected to the external pins of the package of the power module through metallic connections.

The metallic connections are wire bonds and/or metallic vias and/or metallic ribbons and/or direct lead bonding and/or conductive fills.

The present invention is disclosed in an example wherein metallic connections are wire bonds. The same can be applied to metallic vias and/or metallic ribbons and/or direct lead bonding and/or conductive fills.

Considering 20 bonds per semiconductor, the total number of wire bonding connection is extremely high.

Each wire bond being a weakness on the structure of the entire power module, the increase of the number of bonds results in a reduction of the reliability of the power module. During the lifetime of the power module, the cracks appear on the bond region caused by the thermomechanical stress as shown in FIG. 2.

Figure 2:
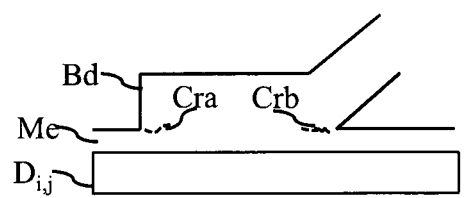
FIG. 2 represents an example of a crack formation on a wire bonded to a metallized power semiconductor surface.

FIG. 2 represents an example of a crack formation on a wire bonded to a metallized power semiconductor surface.

In FIG. 2, a wire bond Bd is bonded to a metallized surface Me of a power semiconductor $D_{i,j}$ with i=1 or 2 and j=1 to N.

Cracks Cra and Crb appear on the bond region caused by the thermomechanical stress.

The power module is not composed by materials having the same CTE. Classically, a power semiconductor in Si has a linear CTE of $2.56e^{-6}/K$ and is metallized with aluminium having a CTE of $23.1e^{-6}/K$. Furthermore, the temperature is not homogenous on the power semiconductor. As consequence, a mechanical deformation appears on the bond structure. The fatigue effects on the bond associated to the temperature swing during the operation result in cracks Cra and Crb that induce the wire-bonding lift-off.

The present invention aims at increasing the temperature of one power semiconductor among the power semiconductors of the power module to a temperature close to the maximum junction temperature of the power semiconductor during the operation of the power module for a duration necessary to achieve interface grain homogenisation. The temperature increase of the power semiconductor is obtained by inducing and controlling a controlled leakage current of the power semiconductor. By consequence, the losses in the power semiconductor increase then the temperature, thus the microstructure of the wire bond is modified by an annealing effect which increases the softness of the wire bond structure and increases its capability to endure deformation contributing to increase the lifetime of the entire power module.

Figure 3:
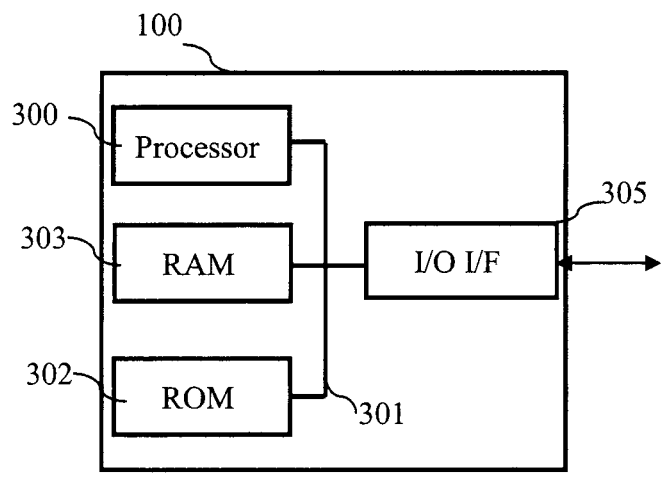
FIG. 3 represents an example of architecture of a device for increasing the reliability of a power module according to the present invention.

FIG. 3 represents an example of architecture of a device for increasing the reliability of a power module according to the present invention.

The device 100 has, for example, an architecture based on components connected together by a bus 301 and a processor 300 controlled by a program.

The bus 301 links the processor 300 to a read only memory ROM 302, a random access memory RAM 303, and an input output I/O interface I/F 305.

Figure 4:
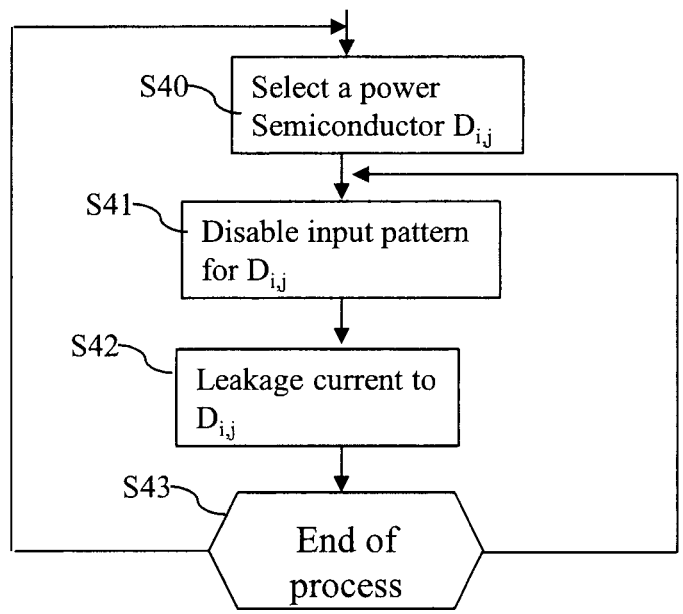
FIG. 4 represents an example of an algorithm for increasing the reliability of a power module according to the present invention.

The memory 303 contains registers intended to receive variables and the instructions of the program related to the algorithm disclosed in FIG. 4.

The read-only memory, or possibly a flash memory 302, contains instructions of the program related to the algorithm disclosed in FIG. 4.

When the device 100 is powered on, the instructions stored in the memory 302 are transferred to the random access memory 303.

FIG. 4 represents an example of an algorithm for increasing the reliability of a power module according to the present invention.

The present algorithm is disclosed in an example wherein it is executed by the processor 300.

At step S40, the processor 300 selects one power semiconductor $D_{i,j}$ among the power semiconductors of the power module, with i=1 or 2 and j is an integer value comprised between 1 and N.

For example, among the power semiconductors of the power module, a queue composed by the power semiconductors is established according to at least one criterion.

For example, the criterion is the age of the wire bonding connection. The power semiconductor with a recent wire bonding interconnection is inserted in the queue.

For example, the criterion is the deterioration of the wire bonding interconnection of a power semiconductor. The deterioration of the wire bonding interconnection may be estimated by the evolution of the junction temperature during the operation, for example, increase of more than 5% of the junction temperature in a given operation point or a given number of the junction temperature cycles, Nc.

The junction temperature may be measured using temperature sensors or Temperature Sensitive Electrical Parameters (TSEP) based techniques.

For example, the criterion is based on the analysis of the historical data of the junction temperature. For example, the criterion is defined according to a rain flow algorithm that treats the historical data of the junction temperature in order to determine the W different temperature levels and the number of cycles Ncw at a given temperature swing $\Delta Tjw$ and at a given average temperature Tjw, combined with a linear accumulation rule based on a damage-law, as shown in the following equation, where the coefficients A, α, Kc are previously determined with power cycling tests:

$$\sum_{w=1}^{W} \frac{Ncw}{A \cdot \Delta Tjw \cdot \exp\left(\frac{1}{Kc \cdot Tjw}\right)} \geq 1$$

For example, the processor 300 selects the power semiconductor on a round robin basis.

At step S41, the processor 300 disables the input pattern that is classically applied to the selected power semiconductor $D_{i,j}$.

At step S42, the processor 300 increases the temperature of the selected power semiconductor $D_{i,j}$ in order to reach a target temperature. The temperature control is performed only for one power semiconductor during the normal operation of the power module.

The increase of the temperature of the selected power semiconductor is performed by inducing and controlling a leakage current of a power semiconductor.

The target power semiconductor temperature is slightly smaller than the maximum junction temperature and smaller than the melting temperature of the power semiconductor interconnections. The time duration of the leakage current control is determined in order to achieve interface grain homogenisation as it will be described in FIG. 6b. The time duration is, for example, obtained by experimental test on the wire bonding and metallization structure in a development phase. The time duration may vary from 2 hours and up to 78 hours.

The leakage current is induced by increasing the gate to source/emitter voltage to a value that is comprised between 100 mV to 2V above the threshold voltage value of the selected power semiconductor.

As a result, a leakage current flows in the selected power semiconductor when the other power semiconductors are blocking the bus voltage V+, V− shown in FIG. 1. Thus, only few amperes are enough to heat the selected power semiconductor. The temperature may be classically controlled by a feedback control system.

Once the time duration ends, the processor 300 moves to step S43.

At step S43, the processor enables the input pattern $IN_i$ for the selected power semiconductor $D_{i,j}$ and checks if there is another power semiconductor in the queue.

If there is at least one other power semiconductor in the queue, the processor 300 returns to step S400 and selects the following power semiconductor in the queue.

Figure 5:
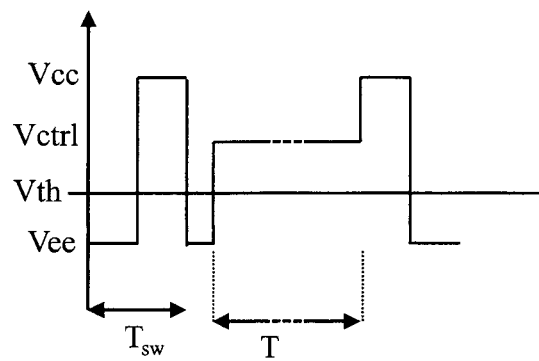
FIG. 5 represents an example of signals that are applied to a selected power semiconductor according to the present invention.

FIG. 5 represents an example of signals that are applied to a selected power semiconductor according to the present invention.

During normal operation, the same input pattern IN is applied to the power semiconductors that are connected in parallel. The applied input pattern IN is for example a signal having a period $T_{sw}$ of several micro seconds. When the power semiconductor $D_{i,j}$ is selected, the leakage current of the semiconductor $D_{i,j}$ is induced and controlled at step S42 during the duration noted T in FIG. 5.

The leakage current is induced by increasing, using the signal Vctrl, the gate to source/emitter voltage to a value higher, but close to the threshold voltage Vth of the selected power semiconductor.

As a result, a leakage current will flow in the selected power semiconductor when the other power semiconductor are blocking the bus voltage V+, V−.

The junction temperature of the selected power semiconductor is increased to the target temperature.

Figure 6A:
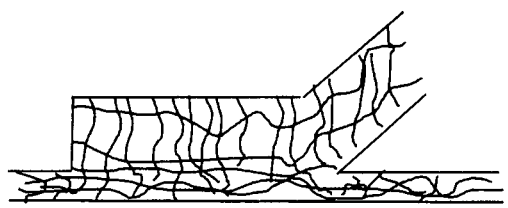
FIG. 6a represents crystallographic characteristics of a wire bonding connection to a metallization surface of a power semiconductor prior to an increase of the reliability of a power module according to the present invention.

FIG. 6a represents crystallographic characteristics of a wire bonding connection to a metallization surface of a power semiconductor prior to an increase of the reliability of a power module according to the present invention. After the process of bonding or during the operation of the power module, the wire-bonding chemical characteristics as depicted in FIG. 6a exists. A fine and poorly sorted grain size on the wire-bonding structure is obtained as shown in FIG. 6a. This results in a hard material having a fine granularity, and a yield point and an ultimate strength, fracture, which occurs at a small amount of strain.

Figure 6B:
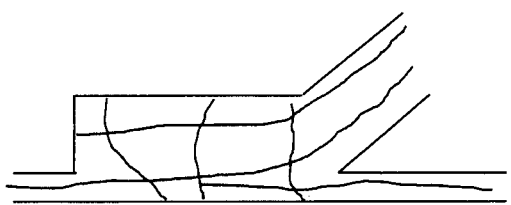
FIG. 6b represents crystallographic characteristics of a wire bonding connection to a metallization surface of a power semiconductor after an increase of the reliability of a power module according to the present invention.

FIG. 6b represents crystallographic characteristics of a wire bonding connection to a metallization surface of a power semiconductor after an increase of the reliability of a power module according to the present invention.

The soft materials, as shown in FIG. 6b have a yield point and an ultimate strength, fracture, which occurs at a large amount of strain. After the application of the thermal treatment according to the invention, the granularity is coarser. As the temperature on the power module imposes a given strain, the soft materials obtained according to the present invention present an increase of the reliability.

Figure 7:
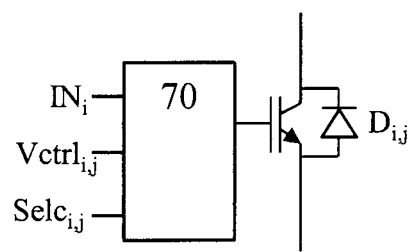
FIG. 7 represents an example of a module for controlling the leakage current of a power semiconductor according to the present invention.

FIG. 7 represents an example of a module for controlling the leakage current of a power semiconductor according to the present invention.

Modules 70 for controlling the leakage current of a power semiconductor are comprised in the input output I/O interface I/F 305.

The power semiconductors $D_{1,1}$ to $D_{1,N}$ and respectively $D_{2,1}$ to $D_{2,N}$ are connected in parallel and are controlled by the same gate to source/emitter voltage $IN_i$ with i=1 or 2 in normal operation. Each power semiconductor has a respective module for inducing and controlling the leakage current of the power semiconductor.

Thus, each gate to emitter/source voltage are controlled in respect to the input signal $IN_i$ in a normal operation mode and can be individually controlled in a leakage mode where the voltage Vctrl is applied to the source/emitter of the power semiconductor.

Each module 70 comprises at least a switch controlled by a signal $Selc_{i,j}$ that enables the voltage Vctrl or INi to be applied to the power semiconductor. For example, the voltage Vctrl is obtained by a classical control structure where the measured junction temperature is subtracted from the target temperature, the result of the subtraction being applied to a multiplication factor and an integral operation.

Figure 8:
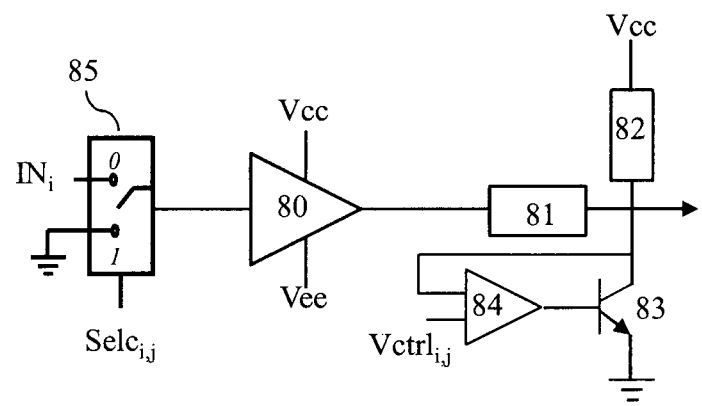
FIG. 8 represents a first example of implementation of the module for controlling the leakage current of a power semiconductor.

FIG. 8 represents a first example of implementation of the module for controlling the leakage current applied to a power semiconductor.

The module for controlling the leakage current of a power semiconductor comprises resistances 81 and 82, a pnp or npn transistor 83 and an operational amplifier 84.

The signal $IN_i$ is fed to a switch 85. The switch 85 selects the signal $IN_i$ or the reference voltage of the gate driver 80 according to the signal $Selc_{i,j}$.

The output of the switch 85 is connected to the input of the gate driver 80.

The first terminal of the resistance 81 is connected to a gate driver 80. The second terminal of the resistance 81 is connected to the gate of the power semiconductor, to a first terminal of the resistor 82, to the collector of the pnp transistor 83 and to the non-inverting input of the operational amplifier 84. The second terminal of the resistance 82 is connected to the positive voltage rail Vcc of the gate driver 80, the emitter of the pnp transistor 83 is connected to the reference voltage of the gate driver 80, the base of the pnp transistor 80 is driven by the output of the operational amplifier 84 and the inverting input port of the operational amplifier is fed with the control voltage value Vctrl.

Figure 9:
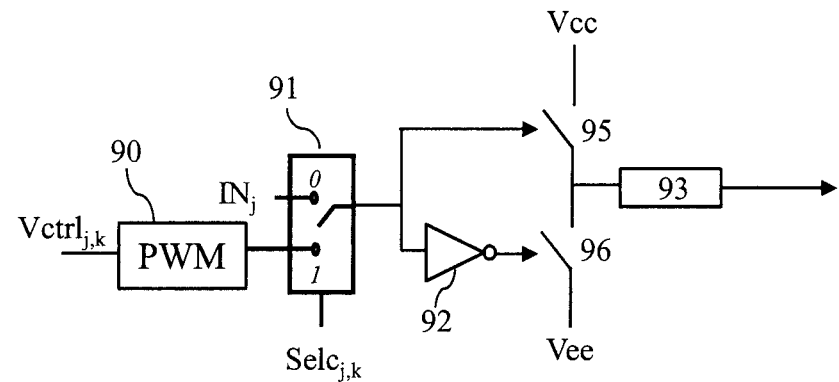
FIG. 9 represents a second example of implementation of the module for controlling the leakage current of a power semiconductor.

FIG. 9 represents a second example of implementation of the module for controlling the leakage current applied to a power semiconductor.

The module for controlling the leakage current applied to a power semiconductor comprises a pulse width modulator 90, three switches 91, 95 and 96, an inverter 92 and a resistance 93.

The signal Vctrl is provided to the pulse width modulator 90, the output of the pulse width modulator 90 is a square waveform with a duty cycle equal to $$\frac{Vctl}{Vcc - Vee}.$$

The frequency of the pulse width modulator 90 is higher enough to obtain a ripple voltage inferior to 100 mV at the gate and source of the power semiconductor if the power semiconductor is a MOSFET, or at the gate and emitter of the power semiconductor if the power semiconductor is an IGBT. The pulse width modulator 90 frequency is defined as:

$$F_{PWM\_90} \geq \frac{Vcc - Vee}{2 \cdot 0.1 \cdot \pi \cdot Cin \cdot Rg}$$

where Cin is the input capacitance of the power semiconductor and Rg is the sum of the resistance 93 and the input resistance of the power semiconductor. The signal $IN_i$ and the output of the pulse width modulator 90 are fed to the switch 91. The switch 91 selects the signal IN$_i$ or the output of the pulse width modulator 90 according to the signal Selc$_{i,j}$.

The output of the switch 91 drives the switch 95 and drives the switch 96 through the inverter 92.

A first terminal of the switch 95 is connected to the positive voltage rail Vcc and a second terminal of the switch 95 is connected to a first terminal of the resistor 93 and to a first terminal of the switch 96.

The second terminal of the switch 96 is connected to the negative voltage rail Vee.

Figure 10:
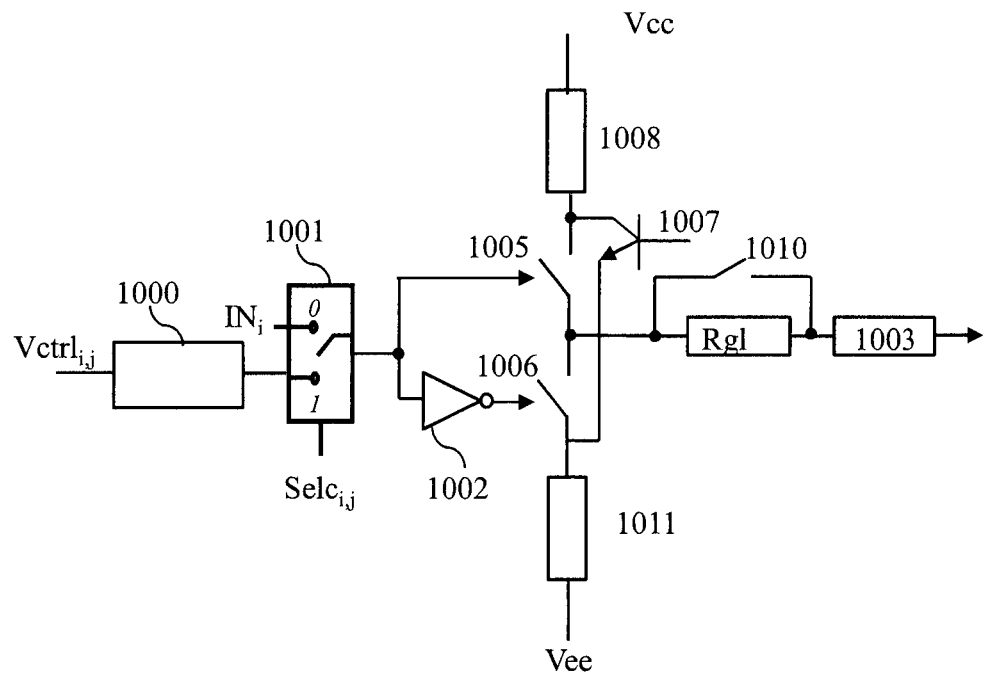
FIG. 10 represents a third example of implementation of the module for controlling the leakage current of a power semiconductor.

FIG. 10 represents a third example of implementation of the module for controlling the leakage current of a power semiconductor.

The module for controlling the leakage current of a power semiconductor comprises a pulse width modulator 1000, four switches 1001, 1005, 1006 and 1010, an inverter 1002, a transistor 1007 and four resistances 1003, 1008, Rg1 and 1011.

The signal Vctrl is provided to the pulse width modulator 1000.

The frequency of the pulse width modulator 1000 is higher enough to obtain a ripple voltage inferior to 100 mV. The pulse width modulator 1000 frequency is defined as:

$$F_{PWM\_90} > F_{PWM\_1000} \geq \frac{VgL}{2 \cdot 0.1 \cdot \pi \cdot Cin \cdot (Rg + Rgl)},$$

where Cin is the input capacitance of the power semiconductor and Rg is the sum of the resistance 1003 and the input resistance of the power semiconductor, VgL is the voltage imposed by the transistor 1007 across the switches 1005 and 1006 when the power semiconductor is selected, where VgL is comprised between $$Vee + \frac{R_{1011}}{R_{1008}} \cdot \left(\left(\frac{R_{1008}}{R_{1011}} + 1\right) \cdot (Vth + 2) - Vcc\right)$$

to Vcc+Vee with Vth being the threshold voltage of the selected power semiconductor. The signal IN$_i$ and the output of the pulse width modulator 1000 are fed to the switch 1001. The switch 1001 selects the signal IN$_i$ or the output of the pulse width modulator 1000 according to the signal Selc$_{i,j}$. The output of the pulse width modulator 1000 is a square waveform with a duty cycle equal to $$\frac{Vctl}{VgL}.$$

The output of the switch 1001 drives the switch 1005 and drives the switch 1006 through the inverter 1002.

A first terminal of the switch 1005 is connected to the positive voltage rail Vcc through the resistor 1008 and to the collector of the transistor 1007. A second terminal of the switch 1005 is connected to a first terminal of the resistor Rg1, to a first terminal of the switch 1010 and to a first terminal of the switch 1006.

The second terminal of the switch 1006 is connected to the emitter of the transistor 1007 and to the negative voltage rail Vee through the resistor 1011. A second terminal of the resistor Rg1 is connected to a second terminal of the switch 1010 and to a first terminal of the resistor 1003.

The base of the transistor 1007 is connected to a signal Vg1. The current of the signal Vg1 is null when the signal IN$_i$ is selected. When the signal Vctrl is selected, the current of the signal Vg1 is enough to maintain a voltage at the collector of 1007 equal or superior to the threshold voltage of the selected power semiconductor plus 2V.

For example, the current of the signal Vg1, when the signal Vctrl is selected, may be controlled by the output of a classical operational amplifier not shown in FIG. 10, the non-inverting input of the operational amplifier is connected to the collector of the transistor 1007 and the inverting input port of the operational amplifier is fed with the voltage value of the threshold voltage of the power semiconductor plus 2V.

The switch 1010 is open when Vctrl is selected and closed when IN$_i$ is selected.

Thus, when the signal IN$_i$ is selected the power semiconductor is controlled relative to Vcc and Vee rails and through the resistance 1003. When the signal Vctrl is selected, the frequency of the pulse width modulator maybe reduced compared to the FIG. 9.

The invention claimed is:

1. A device for increasing the reliability of a power module composed of plural power semiconductors that are connected in parallel, the power semiconductors being connected to the external pins of the package of the power module through metallic connections, characterized in that the device comprises:
    means for selecting one power semiconductor among the power semiconductors connected in parallel according to a criterion,
    means for applying a same input pattern to the not selected power semiconductors connected in parallel,
    means for increasing the temperature of the selected power semiconductor in order to reach a target temperature of the power semiconductor during a time duration,
    means for applying the same input pattern to the selected power semiconductor after the time duration.

2. A method for increasing the reliability of a power module composed of plural power semiconductors that are connected in parallel, the power semiconductors being connected to the external pins of the package of the power module through metallic connections, characterized in that the method comprises the steps of:
    selecting one power semiconductor among the power semiconductors connected in parallel according to a criterion,
    applying a same input pattern to the not selected power semiconductors connected in parallel,
    increasing the temperature of the selected power semiconductor in order to reach a target temperature of the power semiconductor during a time duration,
    applying the same input pattern to the selected power semiconductor after the time duration.

3. The method according to claim 2, characterized in that the criterion is the age of the metallic connection, wherein the power semiconductor with a recent metallic connection interconnection is inserted in a queue.

4. The method according to claim 2, characterized in that the criterion is the deterioration of the metallic connection of the power semiconductor, the deterioration being estimated by the evolution of the junction temperature during the operation of the power semiconductor.

5. The method according to claim 4, characterized in that the evolution of the junction temperature during the operation of the power semiconductor is estimated according to a rain flow algorithm that treats the historical data of the junction temperature in order to determine the W different temperature levels and the number of cycles Ncw at a given temperature swing ΔTjw and at a given average temperature Tjw, combined with a linear accumulation rule based on a damage-law using the following formula:

$$\sum_{w=1}^{W} \frac{Ncw}{A \cdot \Delta Tjw \cdot \exp\left(\frac{1}{Kc \cdot Tjw}\right)} \geq 1$$

where the coefficients A, α, Kc are previously determined with power cycling tests.

6. The method according to claim 2, characterized in that the time duration varies from 2 hours and up to 78 hours.

7. The method according to claim 2, characterized in that the target temperature is smaller than the maximum junction temperature and smaller than the melting temperature of the power semiconductor interconnection.

8. The method according to claim 2, characterized in that the increase of the temperature of the selected power semiconductor is performed by inducing and controlling a leakage current of a power semiconductor.

9. The method according to claim 8, characterized in that the leakage current is induced by increasing the gate to source or emitter voltage of the power semiconductor to a value that is comprised between 100 mV and 2V above the threshold voltage value of the selected power semiconductor.

10. The method according to claim 9, characterized in that the gate to source or emitter voltage of the power semiconductor obtained using a pulse width modulator, the frequency of which is defined as:

$$F_{PWM\_90} \geq \frac{Vcc - Vee}{2 \cdot 0.1 \cdot \pi \cdot Cin \cdot Rg}$$

where Cin is the input capacitance of the power semiconductor, Rg is the sum of a resistance connected to the gate and an input resistance of the power semiconductor and Vcc and Vee are the positive and negative voltage rails of a gate driver that drives the power semiconductor.

11. The method according to claim 9, characterized in that the gate to source or emitter voltage of the power semiconductor obtained using a pulse width modulator, the frequency of which is defined as:

$$F_{PWM\_1000} \geq \frac{VgL}{2 \cdot 0.1 \cdot \pi \cdot Cin \cdot (Rg + Rgl)},$$

where Cin is the input capacitance of the power semiconductor and Rg is the sum of a resistance connected to the gate and an input resistance of the power semiconductor, VgL is a voltage imposed across two switches that are controlled according to the pulse width modulator and that are linked through respective resistors to the positive and negative voltage rails of a gate driver that drives the power semiconductor.

\* \* \* \* \*